United States Patent
Oliphant et al.

(10) Patent No.: US 6,332,784 B1
(45) Date of Patent: Dec. 25, 2001

(54) HOUSING FOR A COMMUNICATIONS CARD

(76) Inventors: David Oliphant, 5532 W. Lockwood Dr., Salt Lake City, UT (US) 84120; Brent Madsen, 25 Sarah St., Providence, UT (US) 84332

( * ) Notice: Subject to any disclaimer, the term of this patent is extended or adjusted under 35 U.S.C. 154(b) by 0 days.

(21) Appl. No.: 09/585,931

(22) Filed: Jun. 2, 2000

(51) Int. Cl.[7] .................................................. H01R 12/00
(52) U.S. Cl. ......................... 439/76.1; 439/676; 439/354; 439/946; 361/686
(58) Field of Search .................................... 439/946, 76.1, 439/344, 676, 354, 906, 687, 696; 361/686, 737, 785

(56) References Cited

U.S. PATENT DOCUMENTS

| | | | |
|---|---|---|---|
| Re. 31,033 | * 9/1982 | Wilson, Jr. et al. | 439/687 |
| 4,290,664 | * 9/1981 | Davis et al. | 439/676 |
| 4,391,485 | * 7/1983 | Urani | 439/687 |
| 4,497,526 | * 2/1985 | Myers | 439/676 |
| 5,183,404 | 2/1993 | Aldous et al. | 439/55 |
| 5,248,267 | * 9/1993 | Weng | 439/676 |
| 5,391,095 | * 2/1995 | Born | 439/676 |
| 5,411,405 | 5/1995 | McDaniels et al. | 439/131 |
| 5,505,633 | 4/1996 | Broadbent | 439/329 |
| 5,509,811 | 4/1996 | Homic | 439/55 |
| 5,561,727 | 10/1996 | Akita et al. | 385/88 |
| 5,608,607 | 3/1997 | Dittmer | 361/686 |
| 5,773,332 | 6/1998 | Glad | 439/344 |
| 5,797,771 | 8/1998 | Garside | 439/610 |
| 5,816,832 | 10/1998 | Aldous et al. | 439/55 |
| 6,012,953 | * 1/2000 | Francis | 439/676 |
| 6,217,391 | 4/2001 | Colantuono et al. | 439/676 |

FOREIGN PATENT DOCUMENTS

WO 95/13633  5/1995  (WO).

* cited by examiner

Primary Examiner—Tho D. Ta
(74) Attorney, Agent, or Firm—Workman, Nydegger & Seeley

(57) ABSTRACT

A communications card, which preferably conforms to the PCMCIA requirements for a Type III PC card, includes a housing formed by a top cover and a bottom cover. An opening is formed in the housing of the communications card sized and the opening is sized and configured to receive a RJ series connector plug such that no portion of the plug extends through either the top surface or the bottom surface of the communications card. In particular, a portion of the top cover defines an upper portion of the opening and a portion of the bottom cover defines a lower portion of the opening. Preferably, the distance from the top surface to the bottom surface of the communications card is generally equal to or less than about 10.5 mm. Additionally, a distance that is generally equal to or less than about 10.1 mm separates the inner upper surface of the opening from the lower inner surface of the opening.

23 Claims, 13 Drawing Sheets

HOUSING FOR A COMMUNICATIONS CARD

BACKGROUND OF THE INVENTION

1. Field of the Invention

The present invention generally relates to a housing for a communications card. More specifically, the present invention relates to a housing for a communications card that includes one or more receptacles that are sized and configured to receive connector plugs, which allow the communications card to be connected to various electronic devices and communications systems.

2. Description of Related Art

Portable computers and other electronic equipment frequently use communications cards to allow electrical communication to be established between electronic devices or to allow electronic devices to be connected to communication systems. The communications cards are typically located internally within the computer or electronic equipment and the cards are relatively small in size. These communications cards, for example, are commonly used with modems, fax/modems, Local Area Network (LAN) adaptors and cellular telephone equipment.

Conventional communications cards are often constructed according to the Personal Computer Memory Card International Association (PCMCIA) guidelines, which set forth the physical specifications and electronic architecture of the cards (also known as PC cards). The PCMCIA guidelines define three types of cards and sockets for support of electronic equipment. For instance, PCMCIA standards require all PC cards to have the same length and width (roughly the size of a credit card), and each card includes a connector to allow it to be connected to the computer or other host device. In particular, according to the known PCMCIA standards, PC cards have a length of 85.6 mm (3.4 inches), a width of 54.0 mm (2.1 inches), and a height of 3.3 mm (0.1 inches), 5.0 mm (0.2 inches) or 10.5 mm (0.4 inches) depending upon if the card is a Type I card, Type II card or Type III card, respectively. Type I PC cards are typically used for memory devices such as read only memory (RAM), flash memory or static random access memory (SRAM). Type II PC cards are generally used with input/output (I/O) devices such as data/fax modems, LANs and mass storage devices. Type III PC cards are used for devices whose components are thicker and require additional space. The PCMCIA guidelines also define corresponding types of sockets. Type I sockets support only Type I cards, Type II sockets support Type I and II cards, and Type III sockets support all three types of cards.

A conventional PC card 10 is shown in FIG. 1. The PC card 10 has a generally rectangular shaped body with a top surface 12, a bottom surface 14, a right side 16, a left side 18, a front end 20 and a rear end 22. The terms "front" and "rear" are used in reference to the direction in which the PC card 10 is inserted into the receiving socket. The front end 20 of the PC card 10 includes a 68-pin connector 24 that is used to connect the card to an electronic device such as a notebook or lap top computer. Disposed within the PC card 10 is a printed circuit board or substrate 26 with various electronic components 28 that provide the necessary circuitry to perform the intended functions of the PC card.

Additionally, a variety of connectors have been developed in order to facilitate electrical communication between electronic devices and to allow electronic devices to be connected to communication systems. Conventional connectors typically include a plug and a corresponding jack that is sized and shaped to receive the plug. Thus, when the plug is inserted into the jack, the connector allows electrical communication to be established between the plug and the jack.

Conventional connectors are frequently constructed according to standards that are well known in the art to promote compatibility and interchangeability. These standard connectors allow various electronic devices and communication systems to be interconnected or linked as desired by the user. A conventional connector that is well known in the art is the RJ-xx series of connectors, such as the RJ-11, RJ-12 and RJ-45 connectors. The RJ series of connectors include a plug and a corresponding jack that is sized and configured to receive the plug. The RJ-11 connector, for example, includes four or six contact pins and is commonly used to attach communication devices, such as telephones, facsimile machines and modems, to electronic devices. The RJ-45 connector includes eight contact pins and it is frequently used to connect LANs or Ethernets to electronic devices. The RJ series of connectors have the same overall configuration except for slightly different widths. Thus, the RJ-11 and RJ-45 connectors have the same general configuration, but the RJ-45 connector is slightly wider than the RJ-11 connector.

As shown in FIGS. 2 and 3, a conventional RJ series connector 30, such as a RJ-11 connector, includes a jack 32 and a plug 34. The plug 34 includes a rectangular contact pin block 36 with a front end 38, a rear end 40, a top surface 42, a bottom surface 44 and a plurality of contacts 46 located proximate the front end of the block. The contacts 46 are recessed within tracks formed in the contact pin block 36, and the contacts are accessible from the front end 38 and bottom surface 44 of the block. A cable 48 is used to electrically connect the plug 34 to a communications system or other electronic device. The front end 38 of the contact pin block 36 typically includes a pair of notches that define front abutment surfaces 50 that are perpendicular to the top surface 42 of the block.

A biased retention clip 52 extends from the top surface 42 of the contact pin block 36. The biased clip 52 includes a broad base 54 in which the front end is integrally attached to the top surface 42 or front end 38 of the block 36, and the other end includes a narrow tab 56 extending away from the base 54. An abrupt transition between the base 54 and the tab 56 creates a pair of retention edges 58 on both sides of the tab 56. The biased clip 52 extends at an angle relative to the top surface 42 of the contact pin block 36 and the biased clip may be elastically deformed towards the top surface of the contact pin block to allow the plug 34 to be inserted and removed from the jack 32.

As best seen in FIG. 2, the jack 32 includes an aperture 60 that is sized and configured to receive the plug 34. The aperture 60 includes a first pair of notches 62 with a first opening 63 disposed between this first pair of notches, and a second pair of notches 64 with a second opening 65 disposed between this second pair of notches. When it is desired to insert the plug 34 into the jack 32, the user depresses the biased clip 52 towards the top surface 42 of the contact pin block 36 and this permits the plug to be inserted into the receptacle. After the plug 34 is inserted into the jack 32, the user releases the biased clip 52 and, as shown in FIG. 3, the biased clip returns to its original position. The plug 34 is securely held within the jack 32 because the retention edges 58 of the biased clip 52 engage the inner surfaces of the second pair of notches 64 and the narrow tab 56 extends through the opening 65 formed between the second pair of notches.

Alternatively, instead of the user depressing the biased clip 52 towards the top surface 42 of the contact pin block 36, the user can simply insert the plug 34 into the aperture 60 and the base 54 of the biased clip 52 will engage the lower surfaces of the second pair of notches 64. This engagement of the base 54 with the lower surfaces of the second pair of notches 64 forces the biased clip 52 downwardly towards the upper surface 42 of the contact pin block 36, and this allows the plug 34 to be inserted into the jack 32. In either case, the plug 34 is securely held within the jack 32 and it cannot be removed by simply pulling on the plug or cable 48 in a direction away from the receptacle. Instead, the biased clip 52 must be depressed towards the upper surface 42 of the contact pin block 36 in order to remove the plug 34 from the receptacle 60.

If excessive force to remove the plug 34 from the jack 32 is applied to either the plug or the cable 48 without depressing the biased clip 52, the biased clip will break. That is, because the biased clip 52 extends through the opening 65 and the retention edges 58 securely engage the inner surface of the second pair of notches 64, the plug 34 cannot be removed from the receptacle without depressing the biased clip. Thus, the biased clip 52 will break and the plug 34 will fail if too much force is applied to the cable 48 or plug 34 without depressing the biased clip 52. Accordingly, if the cable 48 is accidentally stepped on or tripped over, or the computer is suddenly moved, for example, this may break the biased clip 52. Disadvantageously, if the biased clip 52 is broken, the plug 34 must be replaced. Replacement of the plug 34 is frequently time consuming, inconvenient and awkward. Further, the user may be unable to use the communications or electronic device while the plug 34 is broken.

As shown in FIGS. 2 and 3, the jack 32 includes a plurality of contact pins 66 that elastically deform or deflect as the plug 34 is inserted into the aperture 60. In greater detail, each contact pin 66 includes a wire with a straight section 68 and a contact section 70 that are joined by a bend 72. As shown in phantom in FIG. 3, the wire is bent at an angle a of at least 120° with respect to the straight section 68 when the plug 34 is not inserted into the jack 32. When the plug 34 is inserted into the jack 32, the contact 46 on the plug 34 pushes the contact section 70 of the pin 66 downwardly towards the straight section 68 until the contact pin is bent or folded back upon itself at an angle of about 180°. Disadvantageously, bending the contact pin 66 at this severe angle creates significant stresses in the contact pin proximate the bend 72, which may lead to failure of the pin.

The electronic devices used with these conventional RJ series connectors are becoming smaller and smaller. Because these electronic devices are becoming smaller, one or more of the dimensions of the RJ series connector may now be larger than one or more of the dimensions of the electronic device. For example, communications cards that comply with PCMCIA guidelines have a height that is less than the height of conventional RJ series connectors. In particular, communications cards that comply with PCMCIA standards have a height of 10.5 mm for a Type III PC card, but conventional RJ-11 jacks have a minimum height of at least 12.0 mm. Thus, a conventional RJ-11 jack cannot be mounted in a PC card because the height of the RJ-11 jack exceeds the height limitation of the PC card.

As shown in FIG. 4, a known device to connect a RJ series connector to a PC card includes a physical/electrical connector 80 that is attached to the rear end of a PC card 82. The physical/electrical connector 80 includes a generally rectangular shaped body 84 with a conventional RJ series jack or receptacle 86. Disadvantageously, because the physical/electrical connector 80 extends outwardly from the computer 88, the computer may no longer fit within its carrying case, the protruding connector may be easily broken or damaged, the protruding connector may limit the potential uses of the computer, and the connector alters the aesthetics of the computer.

It is also known to use flexible connectors or adaptors to connect RJ series connectors to a communications card. These known adaptors, however, suffer from several drawbacks such as requiring the user to externally carry the adapter from the computer. Thus, the user must remember to bring the adaptor, otherwise the communications card cannot be used. Disadvantageously, users commonly misplace or lose such adaptors. In addition, these known adaptors are typically bulky and that exacerbates the problems associated with externally carrying the adaptor. In addition, these known adaptors typically extend well beyond the periphery of the host computer and that limits the usefulness of the adaptor, and often poses problems when used in tight space confinements.

Other known devices have been developed in order to allow conventional RJ series connectors to be used with PC cards. For example, U.S. Pat. Nos. 5,183,404; 5,335,099; 5,338,210; 5,547,401; 5,727,972 and 5,816,832 disclose assorted devices and methods to connect RJ series connectors to PC cards and other electronic devices. These patents are assigned to the same assignee as the present application and are hereby incorporated by reference in their entireties. Briefly, the above-listed patents generally disclose a thin plate that is slidably mounted to a PC card. The thin plate includes a top surface with an aperture formed therein and a plurality of contact wires mounted to the thin plate. Each contact wire includes a first end that is freely exposed within the aperture and a second end that is connected to the thin plate. A flexible wire ribbon is typically used to electrically connect the second end of the contact wires to contacts on a printed circuit board located within the PC card.

As known in the art, the thin plate selectively slides between an extended position and a retracted position. In the extended position, the aperture is exposed such that a corresponding plug, such as a RJ-11 plug, can be inserted and the contacts on the plug engage the contact wires extending into the aperture. This allows electrical connection to be established between the plug and the printed circuit board. In particular, electrical communication is established between the plug, contact wires, flexible wire ribbon and printed circuit board. When not in use, the thin plate is retracted into the PC card and the aperture is not exposed. The flexible wire ribbon allows the thin plate to be repeatedly moved between the extended and retracted positions because it freely bends or folds as the plate is moved.

Another known device for using a RJ series connector with a PC card is disclosed in U.S. Pat. No. 5,773,332 issued to Glad. As shown in FIG. 5, the Glad patent discloses a communications card 90 that follows the PCMCIA card Type III standards for dimensions and configuration. The Type III PC card 90 includes two receptacles 92, 94 that are designed to receive standard RJ-xx plugs (specifically, a RJ-11 plug and a RJ-45 plug). The Type III PC card 90 also includes an upper surface 96 and a lower surface 98 that form a portion of the housing of the communications card. The Glad patent explains that because the height of a PCMCIA Type III card is still not great enough to allow standard RJ-xx series receptacles to be mounted therein, T-shaped cutouts 100 are removed from the housing of the communications card 40. The T-shaped cutouts 100 accommodate the biased clip 102 and the ridge 104 present on the connector plug 106. The shape of the T-shaped cutout 100 engages the biased clip 102 and the ridge 104 to hold the plug 106 in place. The Type III PC card height limitation of 10.5 mm, however, is not satisfied when the connector plug is inserted into the receptacles because the biased clip 102 extends through the cutout 100 and protrudes through the upper surface 96 of the housing. Disadvantageously, the biased clip 102 can be easily broken or damaged because it protrudes through the upper surface 96 of the card 90. Additionally, the protruding clip 102 may limit design options and uses of the communications card because it does not satisfy the Type III PC card configuration and size requirements. Further, the PC card 90 may not be used in close fitting Type III sockets because the socket may prevent the biased clip 102 from extending through the cutout 100. Thus, the connector plug 106 will not be secured to the PC card 90.

Still another known device for connecting a RJ series connector to a PC card is disclosed in U.S. Pat. No. 5,984,731 issued to Laity. As shown in FIGS. 6 and 7, a plug 110 is inserted into a receptacle 112 located between upper and lower surfaces 114, 116 of a communications card 118. The receptacle 112 includes a cutout 120 to allow the biased clip 122 of the plug 110 to extend through an outer surface of the communications card 118. Specifically, by providing an open bottom (or cutout) in the receptacle, the retention clip, in the fully inserted position of the modular plug, is permitted to project outwardly from the lower, horizontal outer surface of the card. Accordingly, the 10.5 mm height of the Type III card can incorporate a receptacle conforming to the FCC RJ connector standards, if there are cutouts in the lower outer surface of the card.

SUMMARY OF THE INVENTION

A need therefore exists for a housing for a communications card with a receptacle that is sized and configured to receive a connector plug such that no portion of the connector plug protrudes through either the top or bottom surfaces of the communications card. The housing is formed by joining an upper portion or top cover to a lower portion or bottom cover. An opening in the top cover and an opening in the bottom cover are generally aligned to form the receptacle. The communications card preferably complies with the PCMCIA standards for a Type III PC card.

The housing of the present invention advantageously allows communications cards to be connected to standard RJ series connector plugs without deviating from the Type III PC card size and configuration requirements, even when a plug is inserted into a receptacle. The housing also allows communications cards to be interconnected with various electronic devices and communications systems because it receives standard RJ series plugs. Additionally, the housing allows communications cards to be quickly, easily and securely connected and disconnected to desired electronic devices and communications systems. This permits the communications cards to be readily used with portable systems or while traveling. Further, the housing does not require any changes or modifications to the standard RJ series plugs.

One aspect of the present invention is a housing for a communications card with one or more receptacles. The receptacles are preferably disposed in an end of the housing and the communications card desirably complies with the PCMCIA standards for a Type III PC card. Significantly, when a connector plug is received within a receptacle, the connector plug is contained within the receptacle and no portion of the plug, including the biased clip, extends through another surface of the housing. Significantly, because no portion of the plug protrudes through either the upper or lower surfaces of the housing, the housing and the received plug satisfy the 10.5 mm height limitation of a Type III PC card. Advantageously, because no portion of the biased clip protrudes through the upper or lower surfaces of the housing, the clip is less likely to be broken or damaged.

Another aspect is a housing for a communications card that includes a top cover and a bottom cover that are joined together to form the communication card. The top and bottom covers also define the aperture for receiving an RJ-type modular plug. In particular, the top cover defines an upper portion of an aperture and the bottom cover defines a lower portion of an aperture. Thus, when the top and bottom covers are joined, they form an aperture that is sized and configured to receive the modular plug.

Yet another aspect is a housing for a communications card that includes an aperture that is sized and configured to receive a RJ series connector plug. Significantly, no additional components have to be connected to the communications card to define the aperture that receives the connector plug. Advantageously, because the aperture is incorporated into the housing, this allows the height of the communications card to be decreased because no additional components or structures have to be connected to the card in order to receive the connector plug. This helps permit a RJ series connector plug, such as a RJ-11 or RJ-45 connector plug, to be received within an aperture in a Type III PC card.

Still another aspect is a housing that includes a latching area that allows a connector plug to be removed from a receptacle without depressing the biased clip if sufficient force is applied to the plug. Thus, if sufficient force is applied to the connector plug or the cable attached to the plug, the latching area allows the plug to be released from the receptacle without breaking the biased clip or pulling the cable out of the plug. Advantageously, if a large force is accidentally applied to the plug or cable, such as the user stepping on the cable or the computer being unexpectedly moved, the latching area allows the plug to be released from the receptacle without damaging the plug or receptacle.

Yet another aspect is a housing with one or more receptacles that allow RJ series connector plugs to be simply and easily connected and disconnected from a Type III PC card without the use of any adaptors, connectors, or any moving parts. Advantageously, the housing is relatively inexpensive to construct and assemble because a modular jack does not have to be mounted in the housing or connected to a substrate disposed within the housing.

Another aspect is a housing with one or more receptacles that are sized and configured to securely hold RJ series plugs within the receptacles while the biased clip is positioned in a partially compressed configuration. Advantageously, because the biased clip remains partially compressed, the biased clip continually pushes the front and lower surfaces of the plug into the receptacle and that causes the contacts in the receptacle to positively engage the corresponding contacts in the plug. This results in improved electrical communication between the connector plug and the communications card.

Still another aspect is an aperture in the housing of an electronic device that is sized and configured to receive an RJ series plugs. Preferably the height of the aperture is generally equal to or less than 10.5 mm. More preferably, the aperture has a height of about 10.1 mm measured from an upper inner surface to a lower inner surface. Advantageously, because computers and other electronic devices are being driven to thinner and thinner profiles, a relatively small portion of the housing of the electronic device can include an aperture that is sized and configured to receive an RJ series connector plug.

Advantageously, the aperture or opening that receives the RJ series connector plug is very strong and sturdy because it is formed by the housing of the communications card. In addition, because the aperture is defined by the housing of the communication card and not a separate component, it cannot be inadvertently dislodged or disconnected. Further, the housing of the communications card may include fewer parts because a separate component is not used to define the aperture, and this simplifies the manufacturing and assembly process.

Finally, the housing of the communications card may have generally smooth, continuous outer surfaces because a separate component is not used to define the aperture. Thus, the housing can be constructed without protruding edges, gaps, abutting surfaces and the like.

Further aspects, features and advantages of the present invention will become apparent from the detailed description of the preferred embodiments that follow.

BRIEF DESCRIPTION OF THE DRAWINGS

The appended drawings contain figures of preferred embodiments of the housing for a communications card. The above-mentioned features of the housing, as well as other features, will be described in connection with the preferred embodiments. However, the illustrated embodiments are only intended to illustrate the invention and not limit the invention. The drawings contain the following figures.

DETAILED DESCRIPTION OF THE PREFERRED EMBODIMENTS

The present invention involves a housing for a communications card that preferably conforms to the PCMCIA guidelines for a Type III PC card. The principles of the present invention, however, are not limited to a housing for a Type III PCMCIA cards. It will be understood that, in light of the present disclosure, the housing disclosed herein can be successfully used in connection with other types of communications cards, electrical equipment, electronic devices, and communications systems.

Additionally, to assist in the description of the housing, words such as top, bottom, front, rear, right and left are used to describe the accompanying figures. It will be appreciated, however, that the present invention can be located in a variety of desired positions—including various angles, sideways and even upside down. A detailed description of the housing for a communications card now follows.

Figure 1:
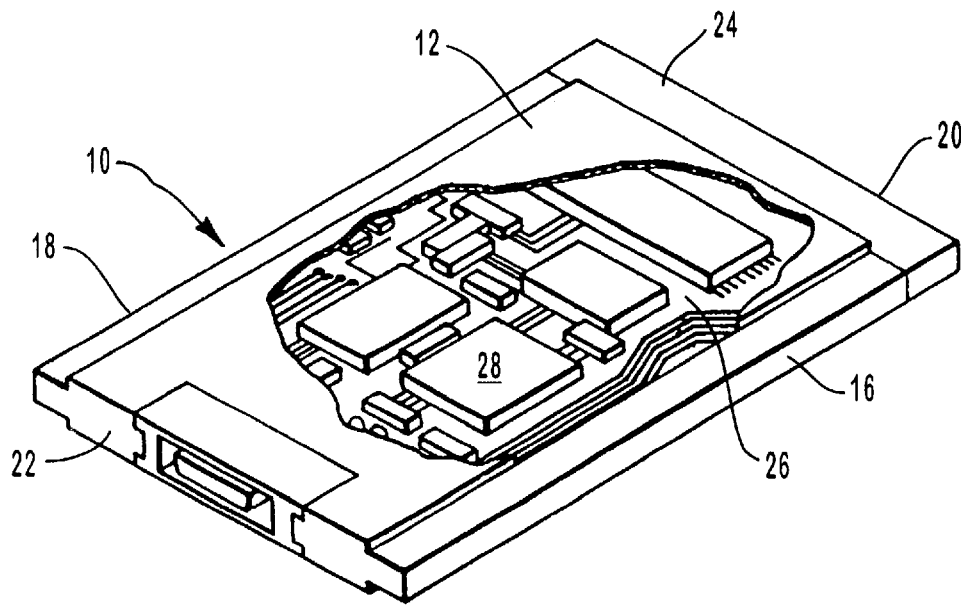
FIG. 1 is a perspective view of a conventional communications card constructed in accordance with PCMCIA standards.
Figure 2:
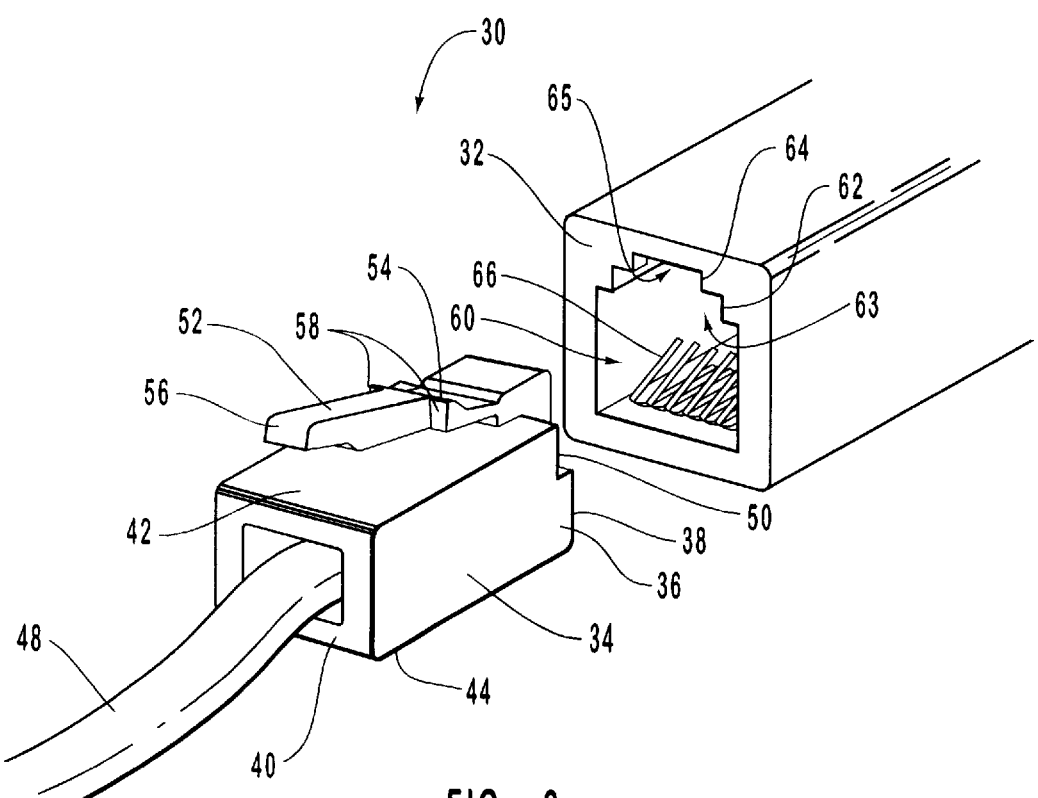
FIG. 2 is a perspective view of a conventional RJ series connector, illustrating a connector plug and a corresponding receptacle.
Figure 3:
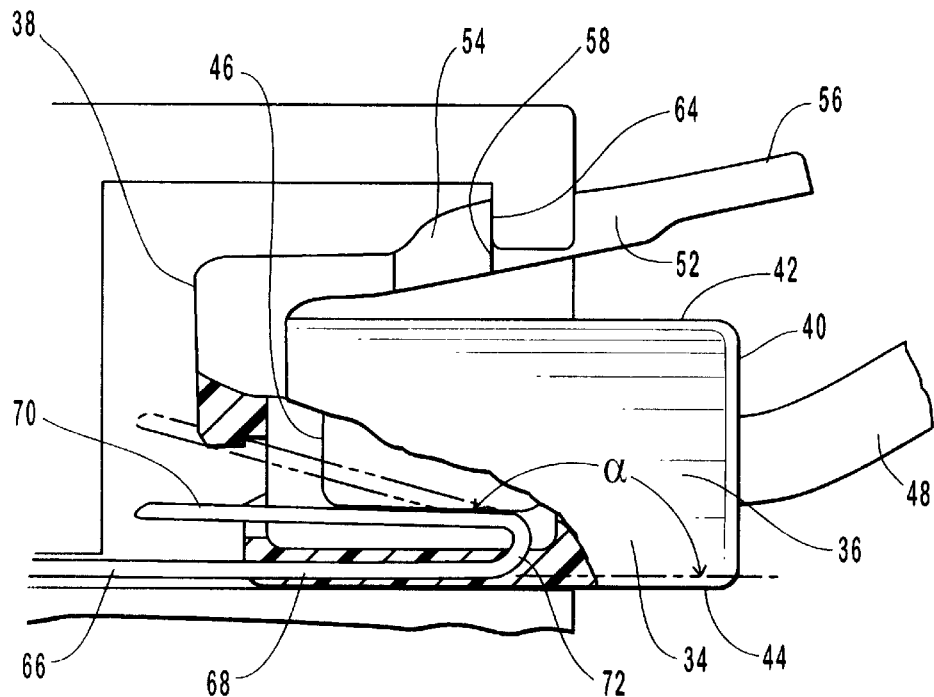
FIG. 3 is a side view of the conventional RJ series connector shown in FIG. 2, with a portion of the connector plug and receptacle cut away, illustrating the plug inserted into the receptacle.
Figure 4:
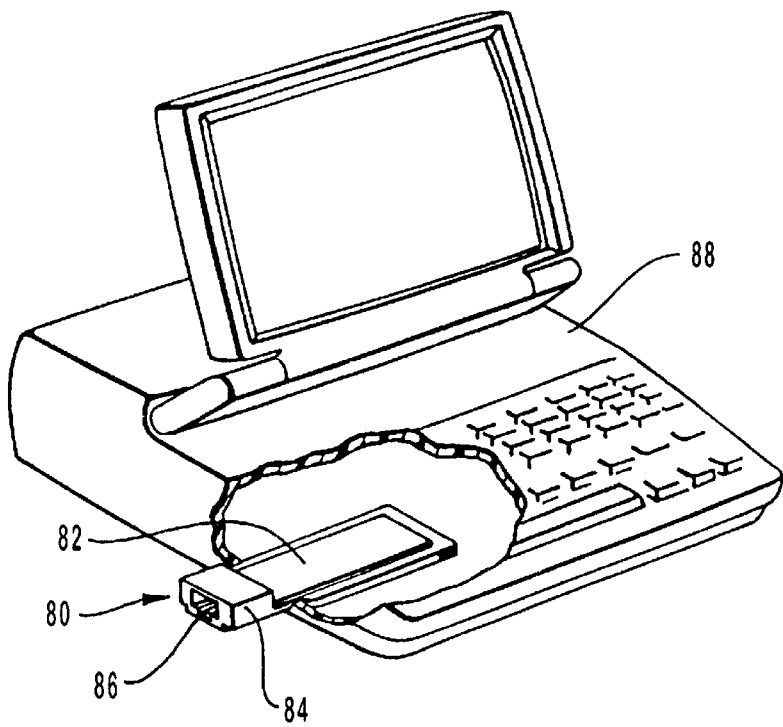
FIG. 4 is a perspective view of a conventional communications card with an integrally attached RJ series receptacle, illustrating the communications card inserted into a computer, with a portion of the computer cut away.
Figure 5:
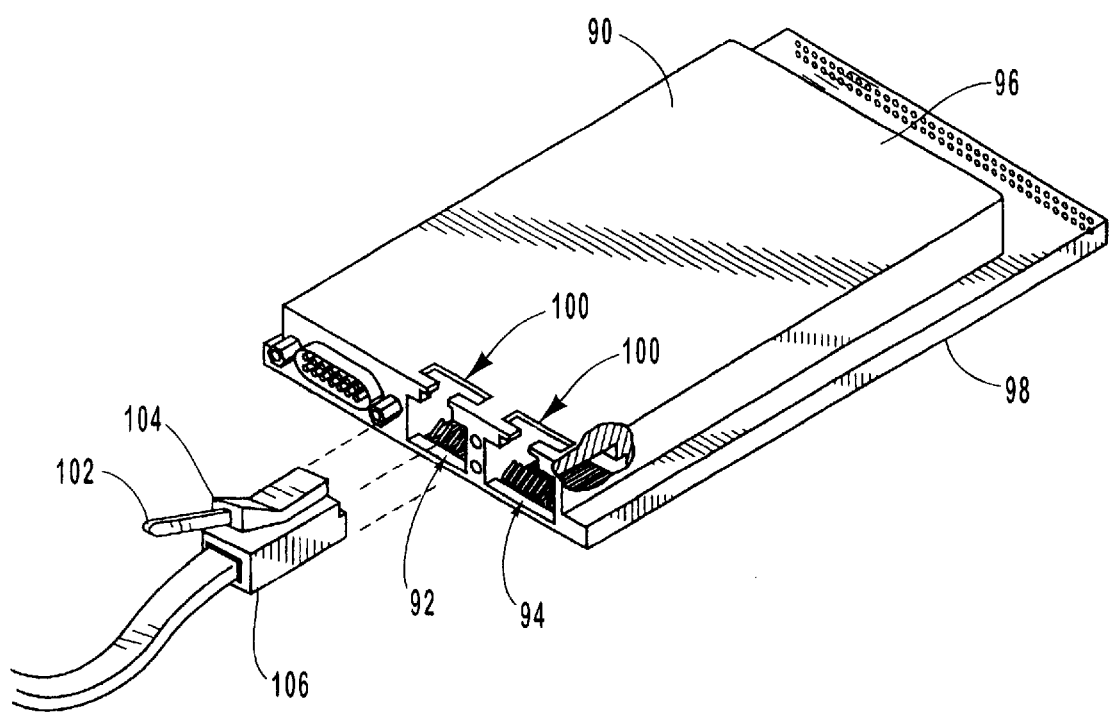
FIG. 5 is a perspective view of a conventional connector for a communications card, illustrating a RJ series plug and cutouts along an upper surface of the communications card.
Figure 6:
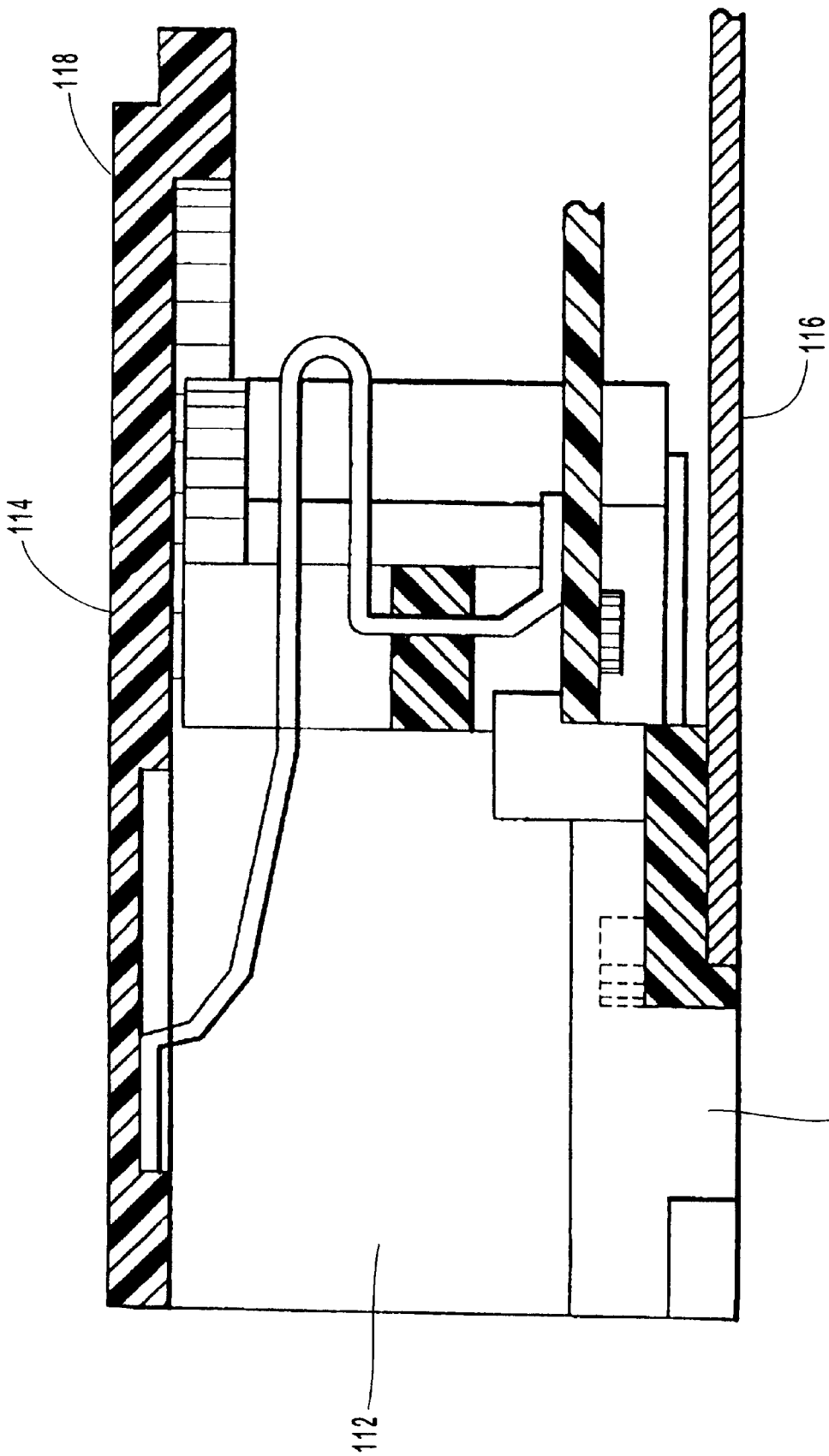
FIG. 6 is a cross-sectional side view of a conventional connector for a communications card, with a portion of the communications card cut away, illustrating a receptacle located in the rear portion of the communications card.
Figure 7:
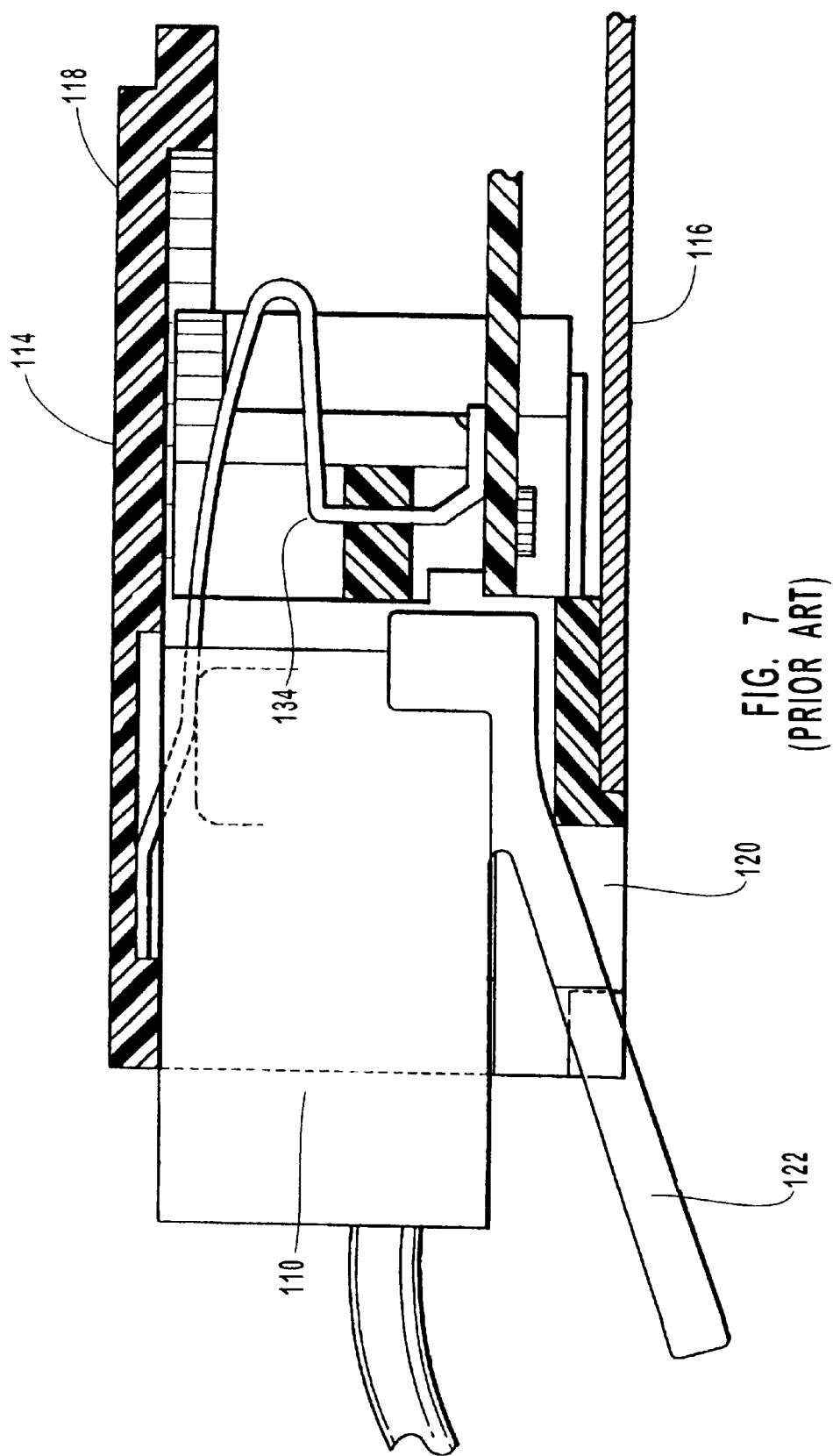
FIG. 7 is a cross-sectional side view of the conventional connector shown in FIG. 6, illustrating a plug inserted into the receptacle.
Figure 8:
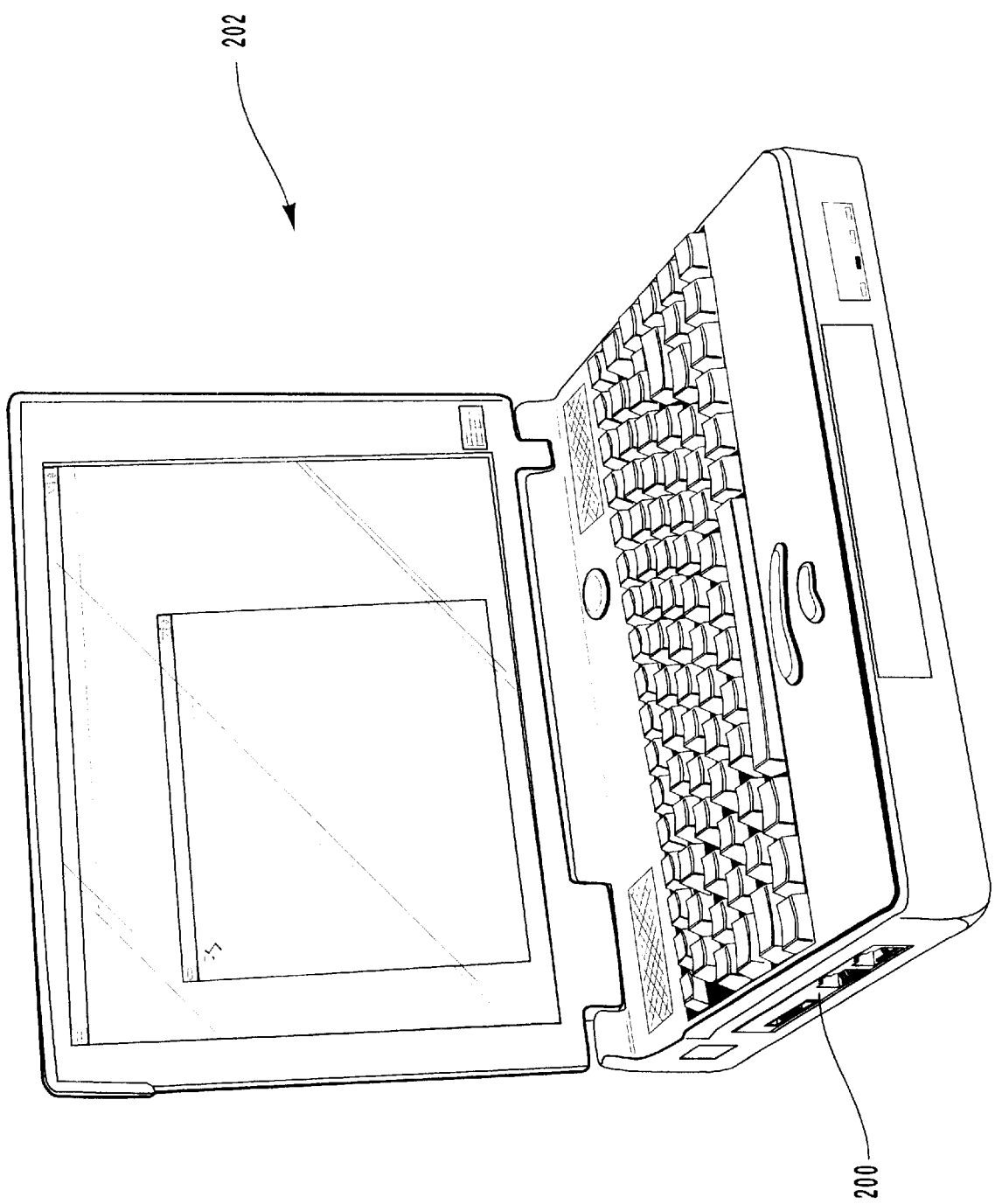
FIG. 8 is a perspective view of a computer including a communications card in accordance with a preferred embodiment of the present invention.

As seen in FIG. 8, a communications card 200 in accordance with a preferred embodiment of the present invention is inserted into a corresponding socket of a host device such as a computer 202. The computer 202 can be any type of a wide variety of computers, including personal, portable, laptop, notebook, palm, personal data assistants (PDAs), etc.

Figure 9:
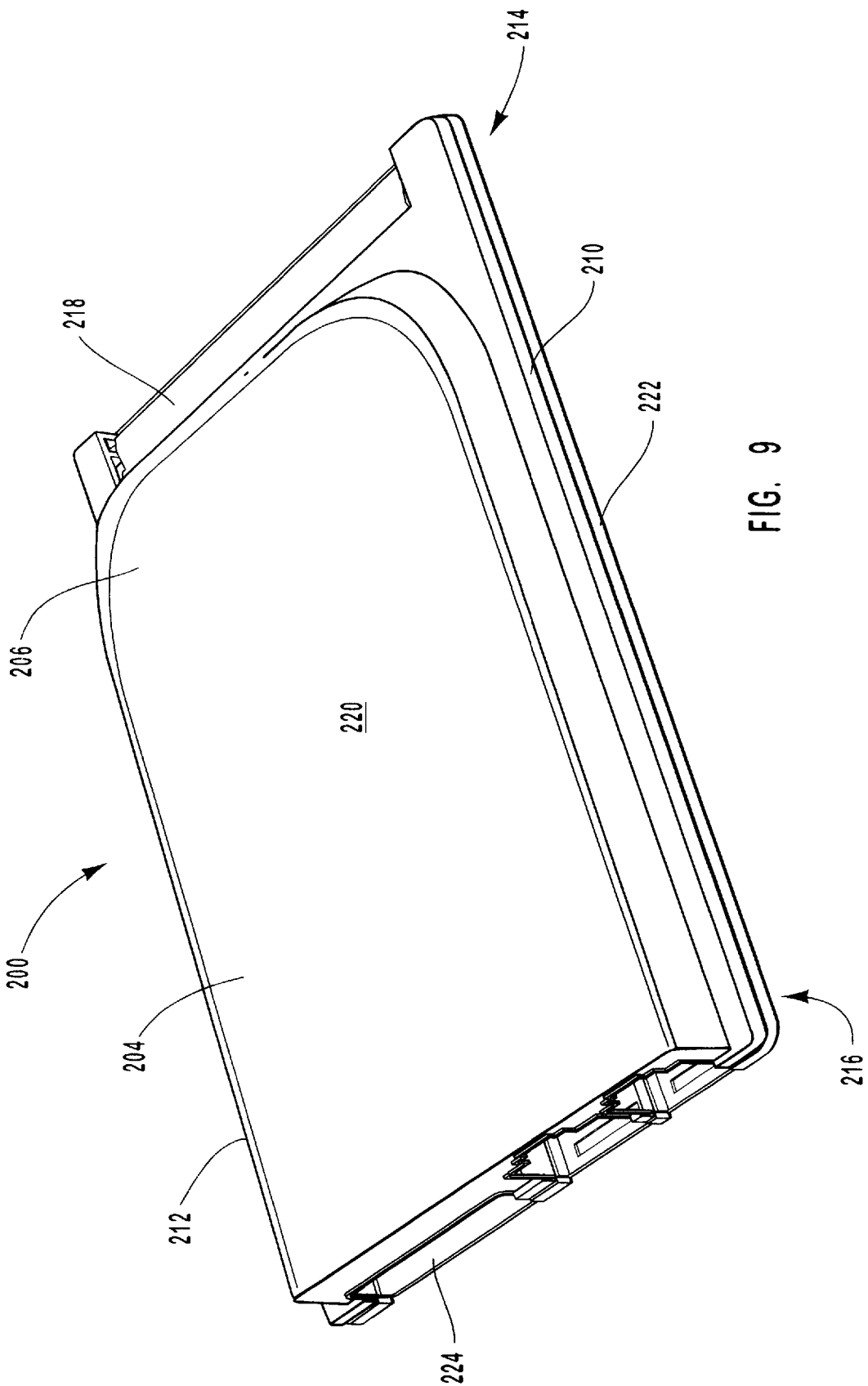
FIG. 9 is a perspective view of the communications card shown in FIG. 8.

As seen in FIG. 9, the communications card 200 includes a housing 204 with a generally rectangular shaped configuration having a top surface 206, bottom surface 208, right side 210, left side 212, front end 214 and rear end 216. One skilled in the art, however, will appreciate that the communications card 200 does not require a generally rectangular shaped configuration. For example, the top and bottom surfaces 206, 208 do not have to be generally planar but could have various suitable shapes and angled surfaces.

The communications card 200 desirably conforms to the Type III PCMCIA standards with a length of 85.6 mm (3.4 inches), a width of 54.0 mm (2.1 inches), and a height of 10.5 mm (0.4 inches), but it will be appreciated that the card may have other desired sizes and configurations that are suitable for its intended purpose, and the card does not have to conform to any specific standards or guidelines. A 68-pin connector 218 is located at the front end 214 of the card 200 to allow the card to be connected with the computer 202, but other suitable connectors such as serial, parallel, SCSI, or other types of ports, may also be used.

Figure 10:
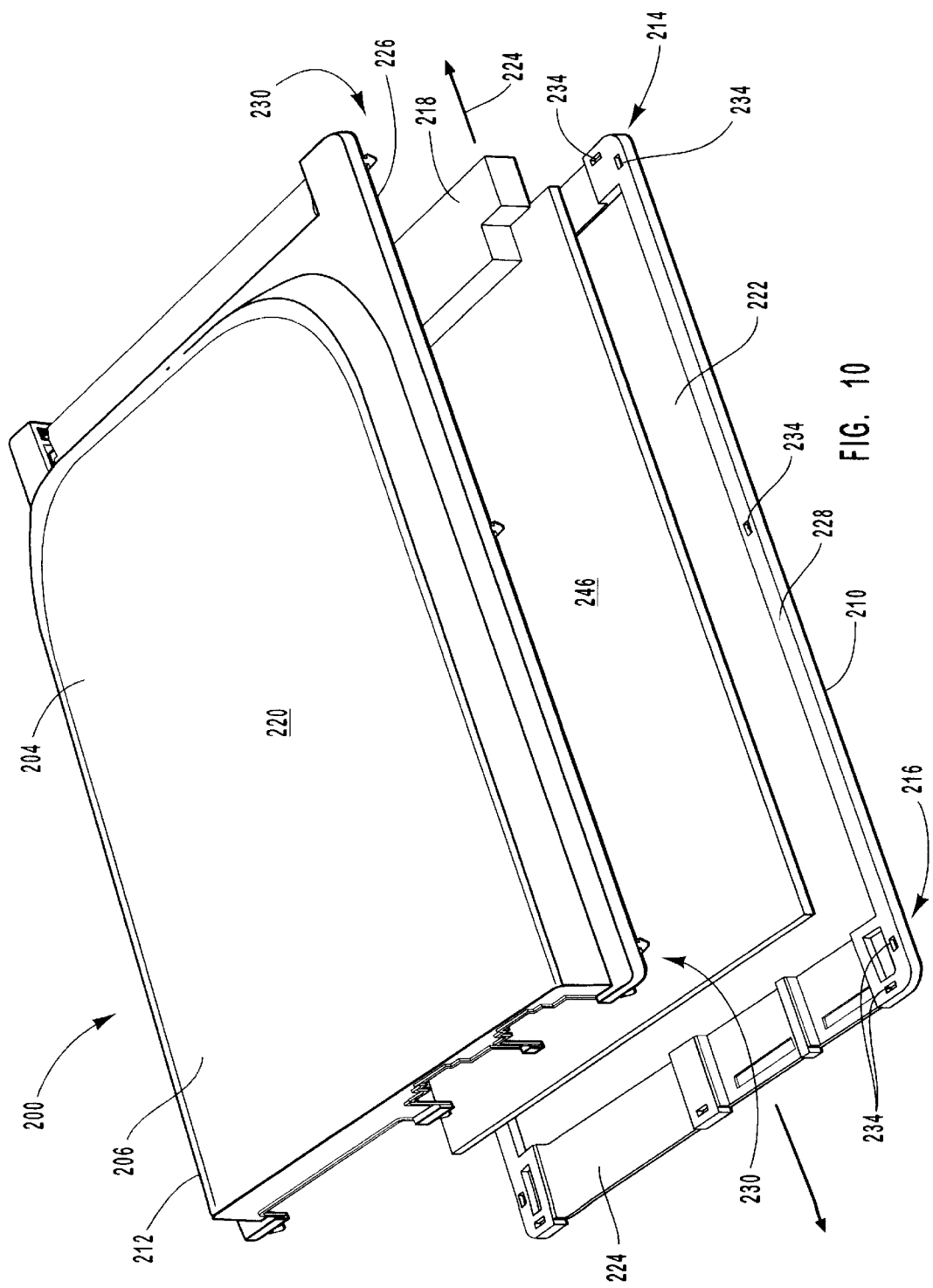
FIG. 10 is an exploded, perspective view of the communications card shown in FIG. 9, illustrating a substrate disposed between a top cover and a bottom cover of the communication card.
Figure 11:
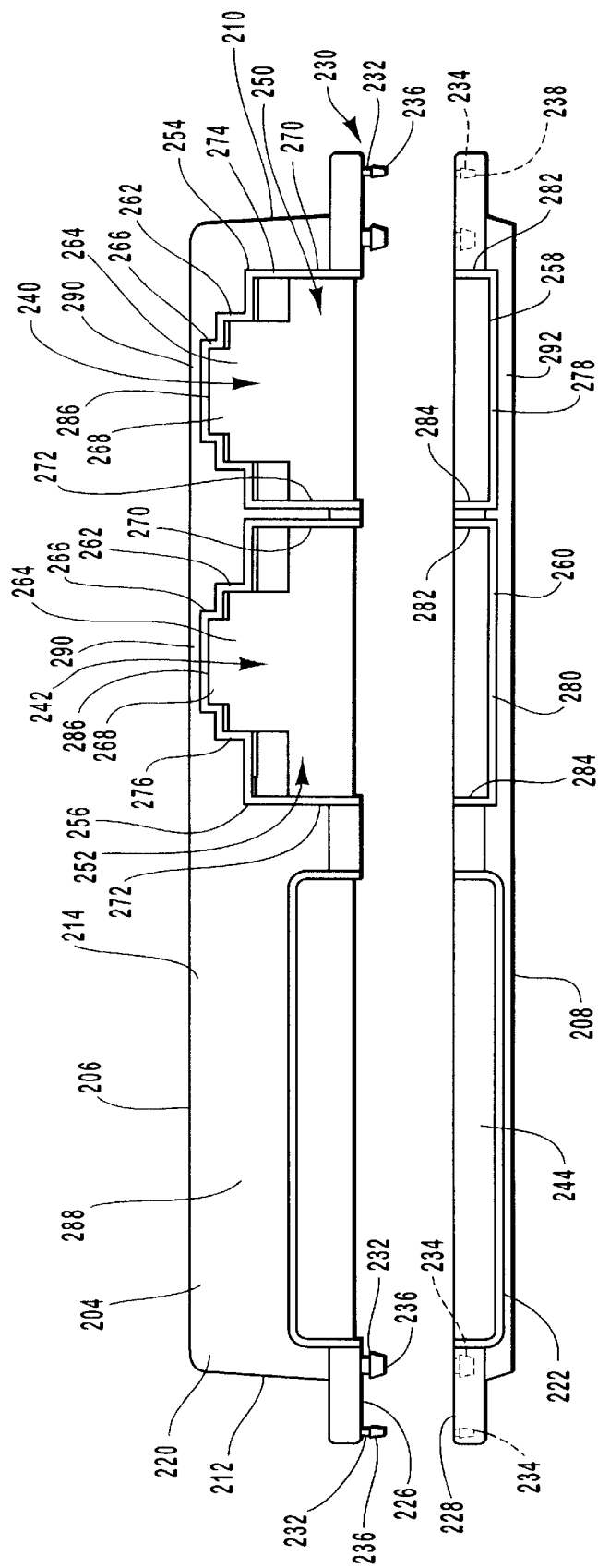
FIG. 11 is an exploded, front view of the communications card shown in FIG. 10.

As best seen in FIGS. 10 and 11, the housing 204 of the communications card 200 includes a top cover or upper portion 220 and a bottom cover or lower portion 222. The top cover 220 and bottom cover 222 form the outer surfaces of the communications card 200 and may also form a portion of the card frame. The top cover 220 and bottom cover 222 are divided along a longitudinal axis 224 that extends along the length of the card 200. The top and bottom covers 220, 222 are divided such that the top cover 200 has a greater height than the bottom cover 222, but it will be appreciated that the covers can have any desired height and divided along any suitable axis. Further, it will be understood that the covers 220, 222 can have other suitable shapes and sizes such as the covers having varying heights and configurations. For example, the top and bottom covers 220, 222 could be divided at an angle relative to the longitudinal axis 224, and a sidewall or other component may be disposed between the covers.

The top and bottom covers 220, 222 are desirably constructed from plastic such as polyethylene, polypropylene or other suitable types of resins or synthetics. The plastic top and bottom covers 220, 222 may be constructed, for example, by injection molding, thermal forming, vacuum forming of a pre-formed sheet of plastic, or the like. The top and bottom covers 220, 222 can be bonded together, for example, by thermal bonding, solvent bonding, ultrasonic welding or other techniques known in the art. The top and bottom covers 220, 222 may also be constructed from electrically conducting materials including metal, such as stainless steel or aluminum. The metal covers can be stamped, machined, bent, shaped, formed, etc. into the desired configuration, and then bonded together, for example, by adhesives, welding or other suitable means. Additionally, the top and bottom covers 220, 222 may be constructed from different materials, such as constructing the top cover from plastic and the bottom cover from metal, and then connecting the covers. One skilled in the art will readily recognize that various metallic or nonmetallic materials with suitable properties and characteristics may be used to create the covers.

The top and bottom covers 220, 222 are joined along mating surfaces 226 and 228, respectively. These mating surfaces 226 and 228 extend along the sides 210, 212 of the communication card 200. The mating surfaces 226 and 228 are generally planar, and the surfaces are configured to abut and contact each other when the covers 220, 222 are joined.

As best seen in FIG. 10, portions of the mating surfaces 226 and 228 are also located along the front end 214 and rear end 216 of the communications card 200. The mating surfaces 226 and 228 may also include gaps or openings to accommodate, for example, the 68-pin connector 218.

As best seen in FIGS. 10 and 11, the top cover 220 includes a plurality of latching tabs or connecting portion 230 that are used to connect the top and bottom covers 220, 222. The latching tabs 230 include downwardly extending projections 232 located along the mating surface 226 of the top cover 220. The projections 232 are preferably located proximate the front end 214 and rear end 216 of the housing 204, and disposed along the right and left sides 210, 212 of the housing. For example, projections 232 can be located proximate the midpoint of the right and left sides 210, 212 of the housing, and in the front end and rear end 214, 216 of the housing. One skilled in the art will appreciate that any suitable number of projections 232 located in any desired positions, may be used.

As shown in the accompanying figures, a corresponding plurality of receiving portions 234 are located in the bottom cover 222 of the housing 204 and the receiving portions are sized and configured to receive the downwardly extending projections 230. In particular, when the top and bottom covers 220, 222 are connected, the projections 232 are inserted into corresponding receiving portions 234 to align and/or attach the covers. Preferably, the projections 232 include a barb or enlarged portion 236 that mates with a corresponding enlarged portion 238 of the receiving portion 232 to securely connect the covers 220, 222. The projections 232 and receiving portions 234 may also be connected, for example, by a friction or interference fit. Additionally, the top and bottom covers 220, 222 can be fastened together by welding, bonding, ultrasonic bonding, adhesives, etc. either independently or in combination with the projections 232 and corresponding receiving portions 234.

Located at the rear end 216 of the communications card 200 are two receptacles 240 and 242 that are sized and configured to receive conventional RJ series plugs. Preferably, the receptacle 240 is sized and configured to receive a RJ-11 connector plug and the receptacle 242 is sized and configured to receive a RJ-45 connector plug, but it will be appreciated that the receptacles can be sized and configured to receive any desired RJ series plug or any other suitable type of plug. Alternatively, the same receptacle may be sized and configured to receive different types of connector plugs such as either an RJ-11 connector plug or an RJ-45 connector, for example.

The rear end 216 of the communications card 200 also includes a Sub-D connector 244 for connection to a cellular telephone or other suitable electronic equipment, but other types of connectors such as a pin, BNC or DIN connectors may also be connected to the communications card. Additional receptacles or connectors of suitable sizes and configurations may also be attached to the rear portion of the communications card 200. Thus, it will be appreciated the communications card 200 may include only a single connector or multiple connectors.

As best seen in FIG. 10, a printed circuit board or substrate 246 is disposed between the top and bottom covers 220, 222 of the housing 204. The printed circuit board or substrate 246 contains various electronic components and circuitry necessary to perform the intended functions of the communications card 200. The 68-pin connector 218 is connected to one end of the printed circuit board 246 and the printed circuit board extends towards the rear end 216 of the housing 204 proximate the receptacles 240, 242. The printed circuit board 246 is preferably entirely contained within the housing 204 of the communications card 200.

The receptacles 240 and 242 disposed in the rear end 216 of the housing 204 include openings 250 and 252 respectively, that are sized and configured to receive the RJ-series connector plugs. The openings 250, 252 are formed by the top cover 220 and bottom cover 222 of the housing 204. In greater detail, the upper portions 254, 256 of the openings 250, 252 are defined by the top cover 220 and the lower portions 258, 260 of the openings are defined by the bottom cover 222. As seen in the accompanying figures, the openings 250, 252 are divided horizontally into the upper portions 254, 256 and lower portions 258, 260 with the upper portions having a greater height than the lower portions, but it will be appreciated that the openings can be divided into any desired configuration. Thus, for instance, the upper portions 254, 256 of the openings 250, 252 in the top cover 220 can define the majority of the openings, or the lower portions 258, 260 of the openings in the bottom cover 222 can define the majority of the opening. Additionally, the openings 250, 252 are preferably divided generally along the longitudinal axis 224 that also divides the top and bottom covers 220, 222, but the openings do not have to be divided in the same manner or along the same lines as the covers. Further, the openings 250, 252 can be divided at suitable angles, including vertically, a series of ramps and/or steps, and the like.

Figure 12:
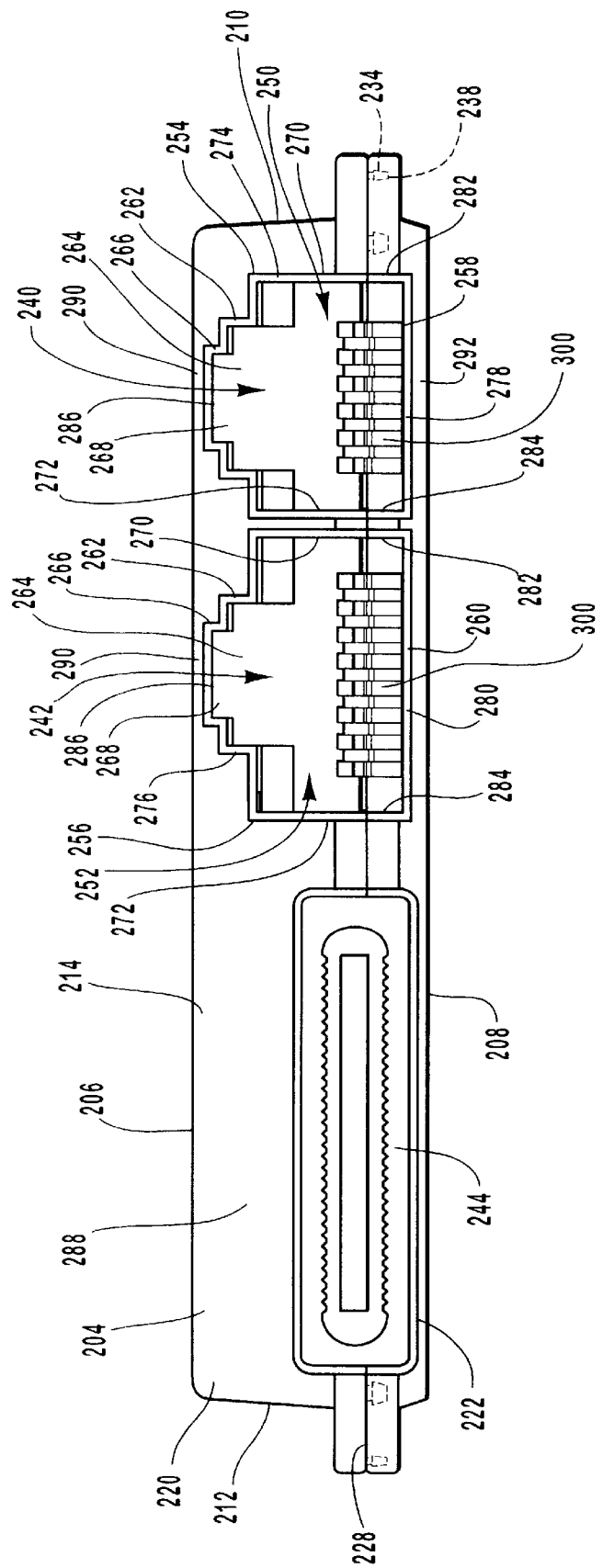
FIG. 12 is a front view of a communications card shown in FIG. 11.

As seen in FIGS. 11 and 12, the upper portions 254, 256 of the openings 250, 252 include a first pair of notches 262 with a first opening 264 disposed between this first pair of notches, and a second pair of notches 266 with a second opening 268 disposed between this second pair of notches. The first opening 264 is sized and configured to receive a base of the flexible biased clip of the RJ-series connector plug and the second opening 268 is sized to receive a narrow tab of the biased clip when the RJ-series plug 268 is inserted into the opening. The upper portions 254, 256 of the openings 250, 252 also include sidewalls 270, 272 and angled, beveled, or rounded edges 274, 276 that assist in inserting the RJ-series connector plug into the openings.

The lower portions 258, 260 of the openings 250, 252 include generally planar lower surfaces 278, 280 and upwardly extending sidewalls 282, 284. The sidewalls 282, 284 of the lower portions of the openings 258, 260 are configured to be vertically aligned with the sidewalls 270, 272 of the upper portions of the openings 254, 256 to form the openings 250, 252. Additionally, the generally planar lower surfaces 278, 280 of the lower portions of the openings 258, 260.

Significantly, the height of the openings 250, 252 to the receptacles 240 and 242 is less than the height of the housing 204 of the communications card 200. Additionally, as shown in the accompanying figures, the openings 250, 252 are located entirely in the rear wall 288 of the housing 204, and neither the upper surface 206 nor the lower surface 208 of the housing contains any openings or cutouts to receive any portion of the RJ-series connector plug. Thus, the receptacles 240, 242 are sized and configured such that the portion of the RJ-series connector plug inserted into the openings 250, 252 is contained entirely within the receptacles, and no portion of the connector plug extends through the upper or lower surfaces 206, 208 of the communications card 200. Advantageously, because the receptacles 240, 242 are formed entirely in the rear wall 288 of the housing 204, the upper surface 206 and lower surface 208 of the housing are generally solid, planar surfaces. Additionally, the upper and lower surfaces 206 and 208 of the housing 204 are generally smooth and continuous surfaces because a separate connector does not have to be attached to the communications card 200. Thus, there are no mating surfaces or gaps formed between a separate connector and the outer surfaces of the communications card 200. Accordingly, there is no protruding edges or surfaces to catch or snag articles.

Advantageously, because the openings 250, 252 to the receptacles 240, 242 are defined by the top and bottom covers 220, 222 of the housing 204, forces associated with inserting and removing the RJ-series connector plugs from the receptacles are primarily transmitted to the housing and not the printed circuit board 246 disposed within the housing. Thus, the printed circuit board 246 is less likely to be damaged and this may extend the expect life of the communications card 200.

In a preferred embodiment, as best seen in FIG. 12, the housing 204 of the communications card 200 has a height of about 10.5 mm measured from the bottom surface 208 to the top surface 206, and the openings 250, 252 have a height of about 10.1 mm measured from the generally planar lower surfaces 278, 280 to the uppermost surfaces 286 of the receptacles 240, 242. An upper wall 290 of the receptacles 240, 242, located between the uppermost surfaces 286 and the top surface 206, has a thickness of about 0.2 mm, and lower wall 292 of the receptacles, located between the generally planar lower surfaces 278, 280 and the bottom surface 208, has a thickness of about 0.2 mm. Although not shown in the accompanying figures, the receptacles 240, 242 have a depth of about 10.8 mm measured to a contact block or upwardly extending wall of a platform. A preferred embodiment of a contact block is shown in co-pending U.S. patent application Ser. No. 09/417,577, entitled Surface Mountable Electrical Connector System, which is assigned to the same assignee as the present application and hereby incorporated by reference in its entirety.

As seen in FIG. 12, one or more contact pins 300 are located within the receptacles 240, 242 of the housing 204. Typically, four or six contact pins are used in conjunction with an RJ-11 connector and eight contact pins are used in conjunction with an RJ-45 connector, but any suitable number of contact pins may be utilized. Advantageously, the contact pins 300 shown in connection with these preferred embodiments can be used in conjunction with both RJ-11 and/or RJ-45 connectors. Thus, the same contact pin design may be used with one or more types of RJ connectors, but at the contact pins may be manufactured in any of a wide variety of designs and configurations in order to be used with specific applications or connectors. Additional details regarding preferred embodiments of the contact pins are provided in assignee's co-pending U.S. patent application Ser. No. 09/528,500, entitled Contact Pin Design for a Modular Jack, which is hereby incorporated by reference it its entirety.

Figure 13:
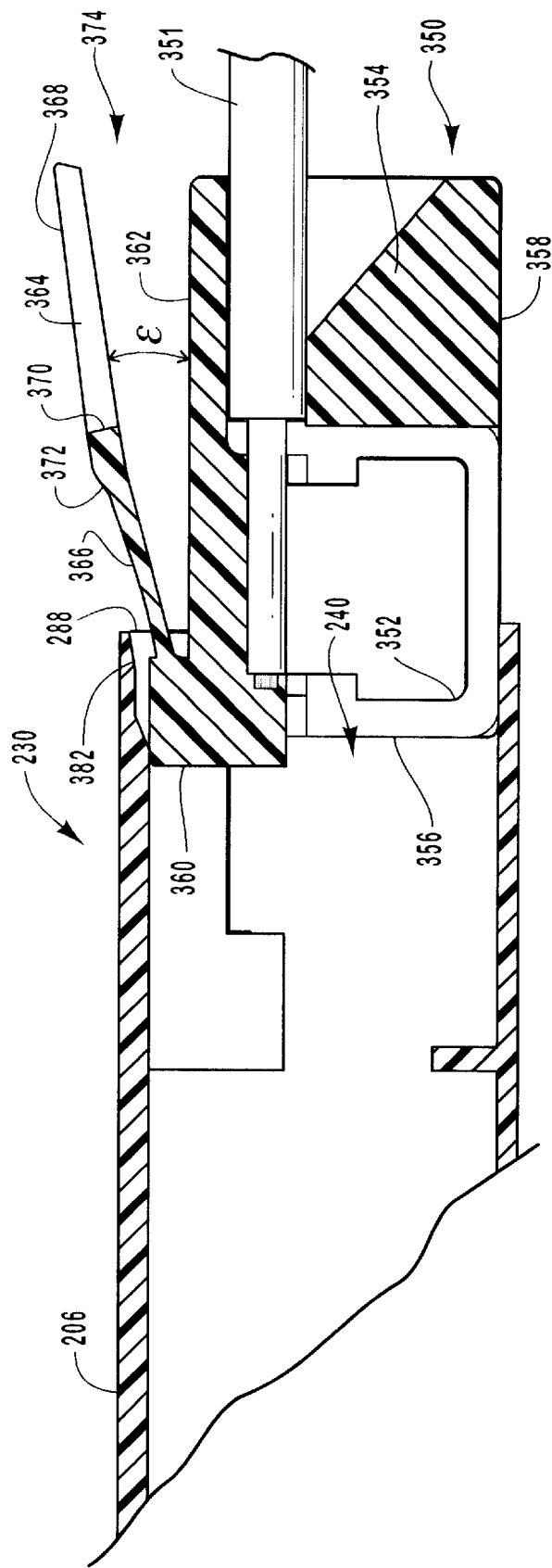
FIG. 13 is a cross sectional side view of the communications card shown in FIG. 9, illustrating a connector plug initially being inserted into a receptacle in the communications card, with a portion of the communications card being cut away.
Figure 14:
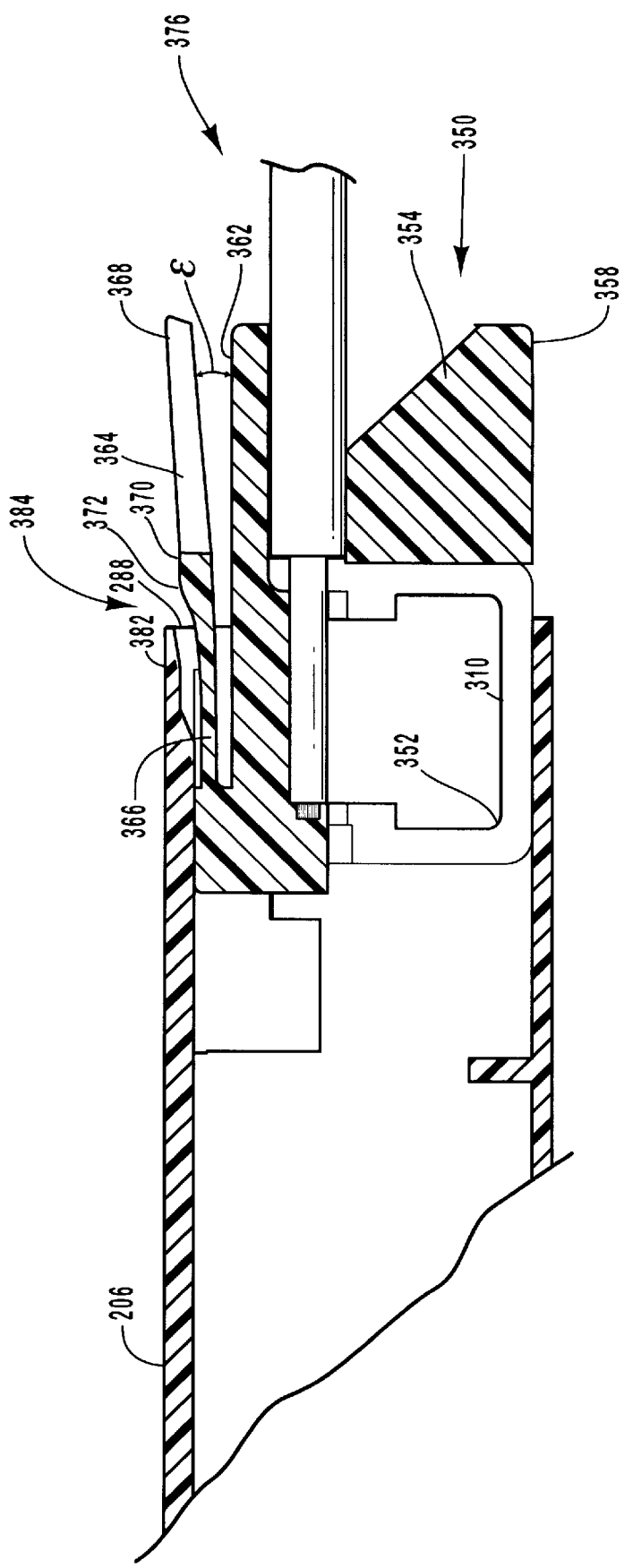
FIG. 14 is a cross sectional side view of the communications card shown in FIG. 9, illustrating a connector plug partially inserted into a receptacle in the communications card, with a portion of the communications card being cut away.
Figure 15:
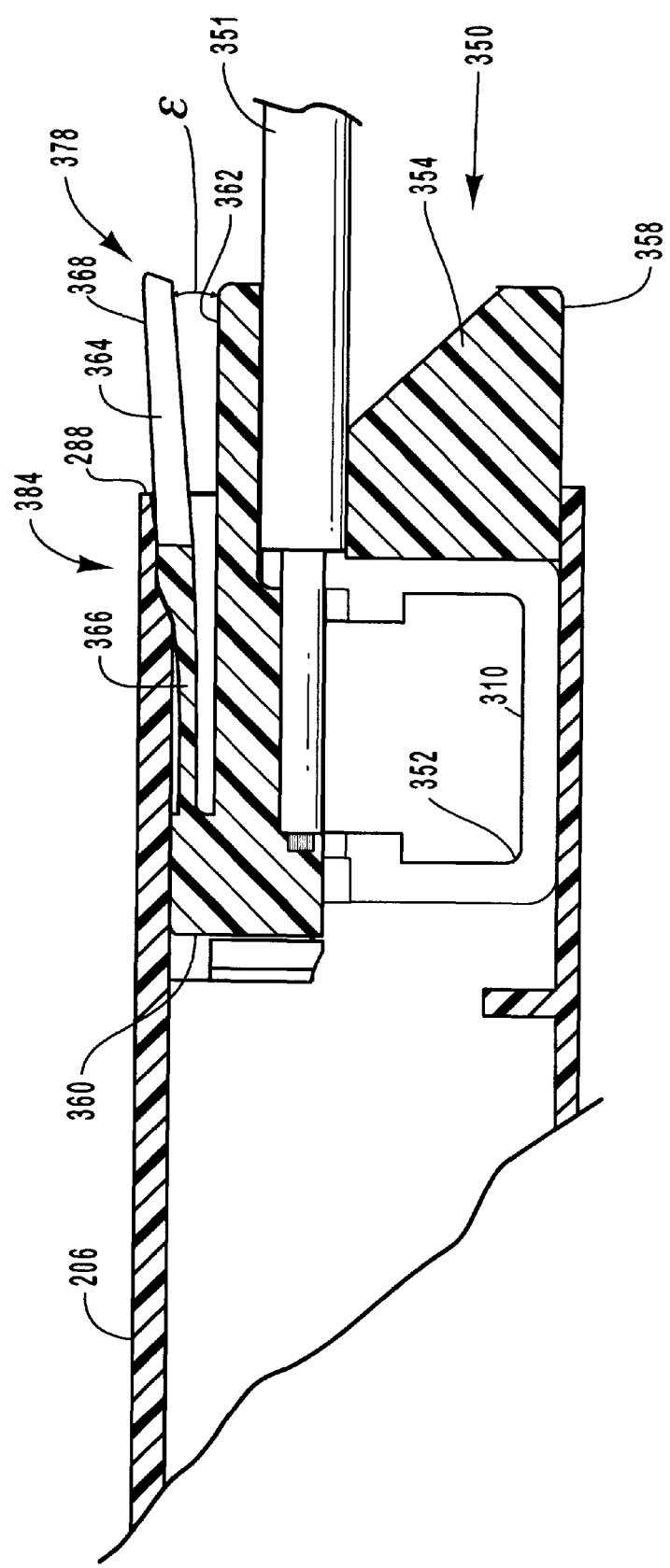
FIG. 15 is a cross sectional side view of the communications card shown in FIG. 9, illustrating a connector plug inserted into a receptacle in the communications card, with a portion of the communications card being cut away.

The connection of the RJ-series connector plug 350 to the receptacle 240 is shown in FIGS. 13 to 15. As known in the art, the plug 350 includes a contact pin block 354 that houses a plurality of contacts 352. The contacts 352 are recessed within tracks that are accessible from front and lower surfaces 356, 358 of the contact pin block 354. The contact pin block 354 includes a forwardly extending surface 360 that is flanked by a pair of notches that define front abutment surfaces (not shown), which are located generally perpendicular to an upper surface 362 of the contact pin block. A biased clip 364 extends upwardly from the upper surface 362 of the contact pin block 354 and it includes a broad base 366 and a narrow tab 368. An abrupt transition between the base 366 and the tab 368 forms retention edges 370 on both sides of the tab. The upper surface of the biased clip 364 may also include an angled or inclined surface 372.

As seen in FIG. 13, the biased clip 364 is in a relaxed position 374 and no external forces are being applied to the biased clip. Thus, the biased clip 364 freely extends at an angle $\epsilon$ relative to the upper surface 362 of the contact pin block 354, and there is a relatively large gap or space between the biased clip and the upper surface of the contact pin block. Because the biased clip 364 is flexible and elastic, it resiliently returns to this relaxed position 374 whenever no external forces are being applied to the clip.

As shown in FIG. 14, in an insertion position 376, the plug 350 is being inserted into the receptacle 240 and the biased clip 364 is deflected downwardly such that it contacts or there is a very small angle $\epsilon$ and little or no gap between the biased clip and the upper surface 362 of the contact pin block 354. The biased clip 364 may be deflected either by the user applying a downward force to the biased clip or, as the plug 350 is inserted into the receptacle 240, the base 366 of the biased clip engages the second pair of notches 266 located proximate the upper wall 290 of the receptacle and this pushes the clip downwardly.

As shown in FIG. 15, in an attached position 378, the plug 350 is fully inserted into the receptacle 240 and the biased clip 364 then springs upwardly because the base 366 of the biased clip 364 no longer engages the notches 266. In this attached position 378, the retention edges 370 of the biased clip 364 contact the rear surfaces of the notches 266 located in the rear wall 288 of the receptacle 240 and the tab 368 extends through the opening 268 between notches. Additionally, the inclined surface 372 of the biased clip 364 nests within a corresponding notch 382 in the upper wall 290 of the receptacle 240. Because the upper wall 290 of the receptacle 240 has a very small thickness, especially proximate the opening 268, it may be desirable to strengthen this portion of the receptacle. For example, a support plate constructed of a relatively high strength material, such as metal, may be insert molded into the upper wall 290.

Significantly, the biased clip 364 remains partially compressed in the attached position 378. Thus, the biased clip 364 continually forces the plug 350 into engagement with the inner portions of the receptacle 240, and this allows positive electrical contact between the plug and electrical contacts disposed within the receptacle. In greater detail, in the attached position 378, the biased clip 364 is biased against the notch 382 in the upper wall 254 of the receptacle, and the clip is positioned at an angle $\epsilon$ between that relaxed position 374 and the insertion position 376. Additionally, in the attached position 378, the biased clip 364 and the upper surface 362 of the contact pin block 354 are separated by a gap that is less than the gap in the relaxed position 374 and larger than the gap in the insertion position 376.

The biased clip 364 maintains this interconnection of the plug 350 and receptacle 240 until the user depresses the biased clip 364 towards the contact pin block 354 to disengage the retention edges 370 of the biased clip from the rear surfaces of the notches 266. The user then can slide the plug 350 out of the receptacle 240 to disconnect the plug from the receptacle. Thus, when the communications card is not in use, the user can disconnect the plug 350 from the receptacle 240 by depressing the biased clip 364 towards the contact pin block 354 and pulling the plug out of the receptacle.

In a preferred embodiment of the openings 250, 252 in the communications card, the retention edges 370 on the biased clip 364 and the rear surfaces of the notches 266, form part of a latching area 384. Advantageously, these edges 370 and surfaces 266 are sized and angled such that when sufficient force is applied to the plug 350, the plug 350 will be released from the receptacle without depressing the biased clip. Thus, if sufficient force is applied to the plug 350 or the cable 351 attached to the plug, the latching area 384 allows the plug to be released from the receptacle 240 without breaking the biased clip 364 or pulling the cable out of the plug. Therefore, if a large force is accidentally applied to the plug 350 or cable 351, such as the user stepping on the cable or the computer being unexpectedly moved, the latching area 384 allows the plug to be released from the receptacle 240 without damaging the plug or the receptacle.

In greater detail, the rear surfaces of the notches 266 are angled slightly forwardly and/or the notches have a smaller height to allow the plug 350 to be removed from the receptacle without depressing the biased clip 364. The retention edges 370 on the biased clip 364 may also be slightly angled and/or have a smaller height to allow the plug 350 to be removed from the receptacle 240 without depressing the biased clip. Additionally, because the biased clip 364 remains partially compressed in the attached position 378 and the tab 368 of the biased clip nests within the notch 382 in the upper surface of the receptacle 240, and the biased clip is not contained within an opening or cutout in the top surface of the communication card, the plug can be removed from the receptacle without depressing the biased clip. One skilled in the art will appreciate that the latching area 384 may have different sizes and configurations depending upon the amount of force required to remove the plug from the receptacle.

Although this invention has been described in terms of a certain preferred embodiment, other embodiments apparent to those of ordinary skill in the art are also within the scope of this invention. Accordingly, the scope of the invention is intended to be defined only by the claims that follow.

What is claimed is:

1. A communications card that conforms to the PCMCIA requirements for a Type III PC card, the communications card comprising:

a top cover portion including a first outer surface, an opposing inner surface, a front surface, and a rear surface;

a bottom cover including a first outer surface, an opposing inner surface, a front surface and a rear surface;

an upper portion of an opening being defined by the top cover;

a lower portion of the opening being defined by the bottom cover, the opening defining an entrance to a receptacle disposed within the communications card, the receptacle being sized and configured to receive a RJ series connector plug such that no portion of the plug extends through either the first outer surface of the top cover or the first outer surface of the bottom cover of the communications card when the connector plug is located in a fully inserted position within the receptacle; and a latching area that is sized and configured to securely hold the RJ series connector plug within the receptacle, the latching area also being sized and configured to allow the RJ series connector plug to be removed from the fully inserted position in the receptacle without damage to the plug and without the user depressing a biased clip of the connector plug if sufficient force is applied to a body of the connector plug.

2. The communications card as in claim 1, wherein the latching area includes a first pair of notches and a second pair of notches in the front wall of the receptacle, wherein at least one of the pairs of notches includes one or more angled inner surfaces to allow the RJ series connector plug to be removed from the receptacle without depressing the biased clip.

3. The communications card as in claim 1, wherein the latching area includes a first pair of notches and a second pair of notches in the front wall of the receptacle, wherein at least one of the pairs of notches includes a height to allow the RJ series connector plug to be removed from the receptacle without depressing the biased clip.

4. A housing for a communication card conforming to Type III PCMCIA standards, the housing including an upper surface, a lower surface, a front end and a rear end, the housing comprising:

a bottom cover including a bottom wall, a first upwardly extending sidewall, a second upwardly extending sidewall, and a rear wall;

a top cover including a top wall, a first downwardly extending sidewall, a second downwardly extending sidewall, and a rear wall;

an opening being entirely disposed within the rear end of the housing, the opening being sized and configured to receive a RJ series connector plug such that no portion of the plug extends through either the top wall or the bottom wall of the housing when the connector plug is located in a fully inserted position; and a latching area that is sized and configured to securely hold the RJ series connector plug within the receptacle, the latching area also being sized and configured to allow the RJ series connector plug to be removed from the fully inserted position in the receptacle without damage to the plug and without the user depressing a biased clip of the connector plug if a predetermined force is applied to a body of the connector plug.

5. A housing for a communication card, the housing comprising:

a top cover including an upper surface and a downwardly extending sidewall;

a bottom cover including a lower surface and an upwardly extending sidewall, the bottom cover being attached to the top cover to form one or more outer surfaces of the housing, the housing complying with the PCMCIA standards for a Type III communication card;

a chamber formed between the top cover and the bottom cover for receiving a printed circuit board, the printed circuit board including electronic circuitry and one or more electrical contacts in electrical communication with a plurality of contact wires that extend into a receptacle;

an upper portion of the receptacle integrally formed in the downwardly extending sidewall of the top cover as part of a one-piece construction; and a lower portion of the receptacle integrally formed in the upwardly extending sidewall of the bottom cover as part of a one-piece construction, the receptacle being sized and configured to receive an RJ series connector plug such that no portion of the connector plug extends through either the upper surface of the top cover or the lower surface of the bottom cover when the connector plug is fully inserted into the receptacle, the receptacle and contact wires being the only structures sized and configured to engage the connector plug in the fully inserted position.

6. The housing as in claim 5, wherein the upper surface of the top cover and the lower surface of the bottom cover are separated by a distance that is generally equal to or less than about 10.5 mm.

7. The housing as in claim 5, wherein the upper portion of the receptacle includes an upper inner surface and the lower portion of the receptacle includes a lower inner surface that are separated by a distance that is generally equal to or less than about 10.1 mm.

8. The housing as in claim 5, wherein the receptacle is sized and configured to receive multiple types of the RJ series connector plug.

9. The housing as in claim 5, wherein the upper surface of the top cover is generally contiguous with no cutouts sized and configured to receive any portion of the RJ series connector plug.

10. The housing as in claim 5, wherein the lower surface of the bottom cover is generally contiguous with no cutouts sized and configured to receive any portion of the RJ series connector plug.

11. The housing as in claim 5, wherein the receptacle is located entirely within the downwardly extending sidewall of the top cover and the upwardly extending sidewall of the bottom cover.

12. A communication card comprising:

a top cover including an upper surface and a downwardly extending sidewall;

a bottom cover including a lower surface and an upwardly extending sidewall, the bottom cover being attached to the top cover to form one or more outer surfaces of the communication card, the communication card complying with the PCMCIA standards for a Type III communication card;

a circuit board disposed within art interior portion of the communication card, the circuit board including one or more electrical contacts in electrical communication with a plurality of contact wires that extend into a receptacle;

an upper portion of a receptacle integrally formed in the downwardly extending sidewall of the top cover as part of a one-piece construction; and a lower portion of the receptacle integrally formed in the upwardly extending sidewall of the bottom cover as part of a one-piece construction, the receptacle being sized and configured to receive an RJ series connector plug such that no portion of the connector plug extends through either the upper surface of the top cover or the lower surface of the bottom cover when the connector plug is fully inserted into the receptacle, the receptacle and contact wires being the only structures sized and configured to engage the connector plug in the fully inserted position.

13. The communications card as in claim 12, wherein the upper surface of the top cover includes a generally solid, planar surface that prevents any portion of the RJ series connector plug from extending through the upper surface.

14. The communications card as in claim 12, wherein the lower surface of the bottom cover includes a generally solid, planar surface that prevents any portion of the RJ series connector plug from extending through the lower surface.

15. The communications card as in claim 32, wherein the receptacle has a height that is generally equal to or less than about 10.1 mm.

16. The communications card as in claim 12, further comprising a latching area for the receptacle, the latching area being sized and configured to securely hold the RJ series connector plug within the receptacle, the latching area also being sized and configured to allow the RJ series connector plug to be removed from a fully inserted position within the receptacle without damage to the plug and without the user depressing a biased clip if sufficient force is applied to a body of the connector plug.

17. An electrical connector comprising:

a top cover including an upper surface, a pair of downwardly extending sidewalls and a downwardly extending rear wall;

a bottom cover including a lower surface, a pair of upwardly extending sidewalls and an upwardly extending rear wall, the bottom cover being connected to the top cover to form a housing for a communication card that complies with the PCMCIA standards for a Type III communication card;

a chamber formed between the top cover and the bottom cover for receiving a printed circuit board, the printed circuit board including electronic circuitry and one or more electrical contacts in electrical communication with a plurality of contact wires that extend into a receptacle;

an upper portion of a receptacle defined by one or more surfaces of the downwardly extending rear wall of the top cover; and a lower portion of the receptacle defined by one or more surfaces of the upwardly extending rear wall of the bottom cover, the receptacle being sized and configured to receive at least a portion of an RJ series connector plug such that no portion of the connector plug extends through either the upper surface of the top cover or the lower surface of the bottom cover when the connector plug is fully inserted into the receptacle, the receptacle and contact wires being the only structures sized and configured to engage the connector plug in the fully inserted position.

18. The electrical connector as in claim 17, wherein the upper portion of the receptacle is integrally formed in the downwardly extending rear wall of the top cover as part of a one-piece construction.

19. The electrical connector as in claim 17, wherein the lower portion of the receptacle is integrally formed in the upwardly extending rear wall of the bottom cover as part of a one-piece construction.

20. The electrical connector as in claim 17, wherein the upper surface of the top cover includes a generally solid, planar surface that prevents any portion of the RJ series connector plug from extending through the upper surface.

21. The electrical connector as in claim 17, wherein the lower surface of the bottom cover includes a generally solid, planar surface that prevents any portion of the RJ series connector plug from extending through the lower surface.

22. The electrical connector as in claim 17, wherein the receptacle has a height that is generally equal to or less than about 10.1 mm.

23. The electrical connector as in claim 17, further comprising a latching area for the receptacle, the latching area being sized and configured to securely hold the RJ series connector plug within the receptacle, the latching area also being sized and configured to allow the RJ series connector plug to be removed from a fully inserted position within the receptacle without damage to the plug and without the user depressing a biased clip if sufficient force is applied to a body of the connector plug.

* * * * *

UNITED STATES PATENT AND TRADEMARK OFFICE
CERTIFICATE OF CORRECTION

PATENT NO. : 6,332,784 B1
DATED : December 25, 2001
INVENTOR(S) : David Oliphant and Brent Madsen It is certified that error appears in the above-identified patent and that said Letters Patent is hereby corrected as shown below:

<u>Title page,</u>
Item [57], ABSTRACT,
Line 5, after "card" delete "sized".

<u>Column 1,</u>
Line 42, change "(RAM)" to -- (ROM) --.

<u>Column 3,</u>
Line 38, after "angle" change "a" to -- a --.

<u>Column 11,</u>
Line 60, before "life" change "expect" to -- expected --.

Signed and Sealed this

Twenty-fifth Day of October, 2005

JON W. DUDAS
*Director of the United States Patent and Trademark Office*